(12) United States Patent
Lee et al.

(10) Patent No.: US 6,341,095 B1
(45) Date of Patent: Jan. 22, 2002

(54) APPARATUS FOR INCREASING PULLDOWN RATE OF A BITLINE IN A MEMORY DEVICE DURING A READ OPERATION

(75) Inventors: Michael Ju Hyeok Lee; Jose Angel Paredes, both of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/788,819

(22) Filed: Feb. 21, 2001

(51) Int. Cl.[7] .............................................. G11C 13/00
(52) U.S. Cl. .................................. 365/203; 365/189.01
(58) Field of Search ................................. 365/154, 203, 365/207, 189.01, 156

(56) References Cited

U.S. PATENT DOCUMENTS

| | | |
|---|---|---|
| 4,572,972 A | 2/1986 | Shoji |
| 5,579,276 A * | 11/1996 | Yoon et al. .................. 365/226 |
| 5,784,311 A | 7/1998 | Assaderaghi et al. |
| 5,930,178 A | 7/1999 | Hsu et al. |
| 6,104,654 A | 8/2000 | Spence |
| 6,108,256 A | 8/2000 | Schneider |

* cited by examiner

Primary Examiner—Terrell W. Fears
(74) Attorney, Agent, or Firm—Casimer K. Salys; Bracewell & Patterson, L.L.P.

(57) ABSTRACT

An apparatus for increasing pulldown rate of a bitline in a memory device during a read operation is disclosed. The memory device includes a pair of complementary differential bitlines, and each of the complementary differential bitlines has a precharge transistor. The memory device also includes multiple storage cells coupled between the complementary differential bitlines. Furthermore, each of the complementary differential bitlines has a discharge transistor for increasing the pulldown rate of a respective bitline during a read operation.

20 Claims, 2 Drawing Sheets

APPARATUS FOR INCREASING PULLDOWN RATE OF A BITLINE IN A MEMORY DEVICE DURING A READ OPERATION

BACKGROUND OF THE INVENTION

1. Technical Field

The present invention relates to semiconductor devices in general and, in particular, to memory devices. Still more particularly, the present invention relates to an apparatus for increasing pulldown rate of a bitline within a memory device during a read operation.

2. Description of the Prior Art

Static random access memories (SRAMs) are commonly utilized within high-speed computer systems. A typical SRAM circuit includes multiple storage cells arranged in an array. Each column of the array has two complementary bitlines for reading a stored digital value from and for writing a new digital value to one of the storage cells within the column. Complementary bitlines enables a read circuit, such as a sense amplifier, to utilize differential sensing techniques for evaluating the state of a storage cell. When implementing a differential sensing scheme using complementary bitlines, a circuit designer must take into account the voltage range to which the complementary bitlines should be charged. The smaller the voltage range, the more efficient the differential sensing scheme becomes. However, a sense amplifier having a relatively small voltage range is also more prone to noise interferences.

In order to improve read and write access speed, a precharge circuit is typically utilized to initialize bitlines to a high state before a read operation. The result is storage cells having rapid access times for both read and write operations and having considerable stability when switching from one state to another. During a read operation, one of the many storage cells within a column may pull a bitline from its precharged logic high state down to a logic low state. However, because of the capacitive load attributed by other storage cells within the same column, the pulldown rate of the bitline may tend to be relatively slow. Thus, it would be desirable to provide an apparatus for increasing the pulldown rate of a bitline during a read operation.

SUMMARY OF THE INVENTION

In accordance with a preferred embodiment of the present invention, a memory device includes a pair of complementary differential bitlines, and each of the complementary differential bitlines has a precharge transistor. The memory device also includes multiple storage cells coupled between the complementary differential bitlines. Furthermore, each of the complementary differential bitlines has a discharge transistor for increasing the pulldown rate of a respective bitline during a read operation.

All objects, features, and advantages of the present invention will become apparent in the following detailed written description.

DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DESCRIPTION OF A PREFERRED EMBODIMENT

Figure 1:
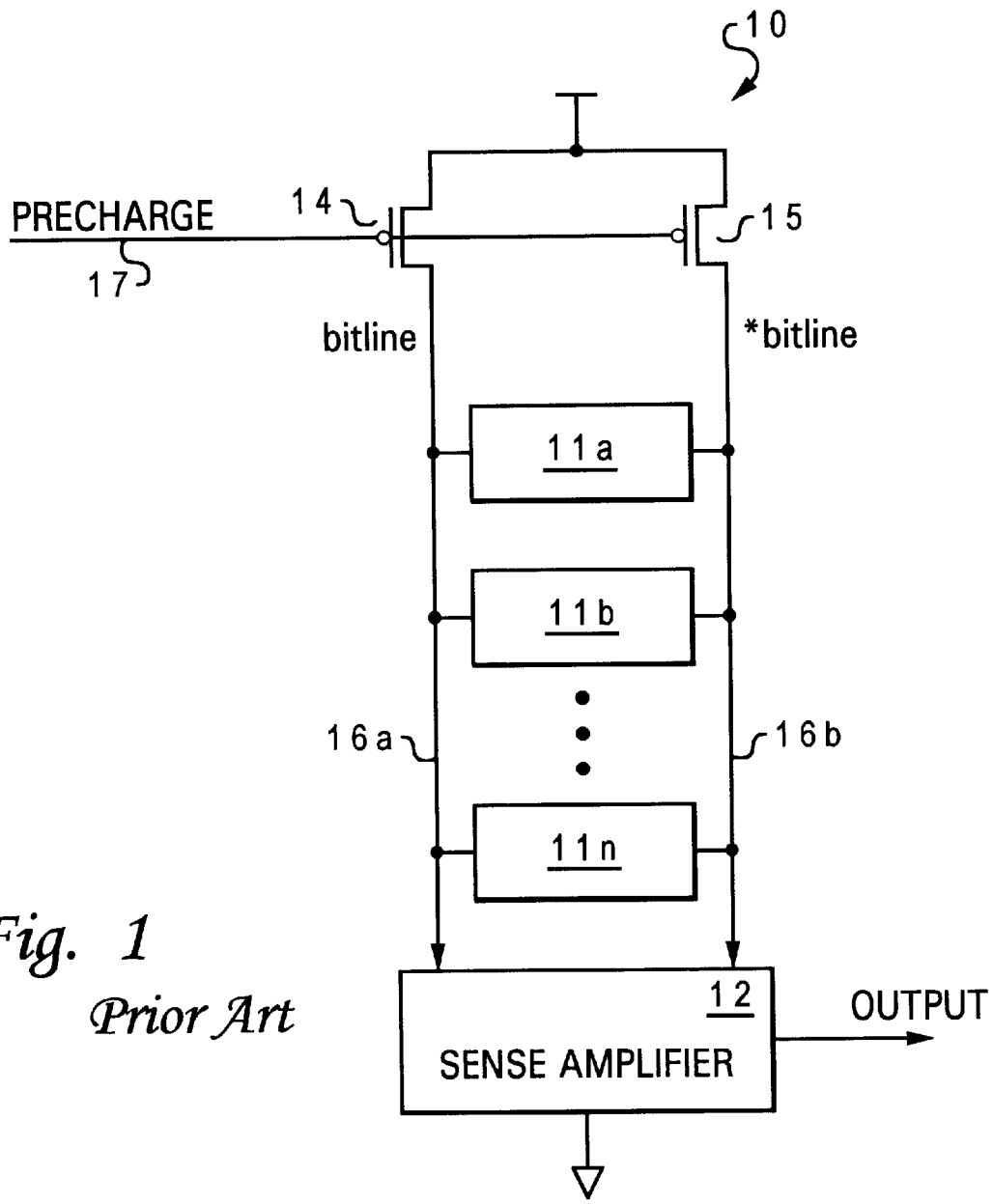
FIG. 1 is a block diagram of a column of storage cells within a memory device, according to the prior art.

Referring now to the drawings and, in particular, to FIG. 1, there is depicted a block diagram of a column of storage cells within a memory device, according to the prior art. As shown, a memory device 10 includes storage cells 11a–11n, a sense amplifier 12, and a precharge circuit (not shown). Each of storage cells 11a–11n are configured to output its stored logic state onto complementary differential bitlines 16a and 16b differentially. In other words, each of storage cells 11a–11n concurrently outputs a logic value onto bitline 16a and its complementary logic value onto *bitline 16b. After reading the differential signal on differential bitlines 16a and 16b, sense amplifier 12 then outputs either a logic "1" or "0" in response to the differential signal.

Before a read operation, differential bitlines 16a and 16b are precharged by p-channel precharge transistors 14 and 15 that are coupled between a voltage supply and differential bitlines 16a and 16b, respectively. A precharge cycle begins when a precharge signal at a precharge line 17 enters a logic low state. During the precharge cycle, precharge transistors 14 and 15 are driven by an active-low precharge signal issued by the precharge circuit (not shown) at precharge line 17. After precharge transistors 14, 15 are turned on by the active-low precharge signal, bitlines 16a and 16b are precharged by precharge transistors 14 and 15 to a voltage value of the power supply. After the precharge cycle has been completed, any one of storage cells 11a–11n is allowed to drive bitlines 16a, 16b. For example, during a read operation, one of bitlines 16a, 16b may be driven to a logic high state (a relatively simple condition since each bitline has already been charged to a high state) while the other bitline will be driven to a logic low state. As the bitlines start diverging in their respective voltage values, sense amplifier 12 senses the difference in voltage values between bitlines 16a, 16b, and sense amplifier 12 then drives its output to either a logic high or a logic low state depending on the voltage differential.

If the stored value in a storage cell being read is a logic "0" during a read operation, bitline 16a will be pulled from a precharged logic high state down to a logic low state, while *bitline 16b will maintain its precharged logic high state. However, due to the capacitive load of storage cells 11b–11n, the pulldown rate of bitline 16a is relatively slow. Thus, additional circuits need to be inserted within memory device 10 to enhance its bitline pulldown rate during read operations.

Figure 2:
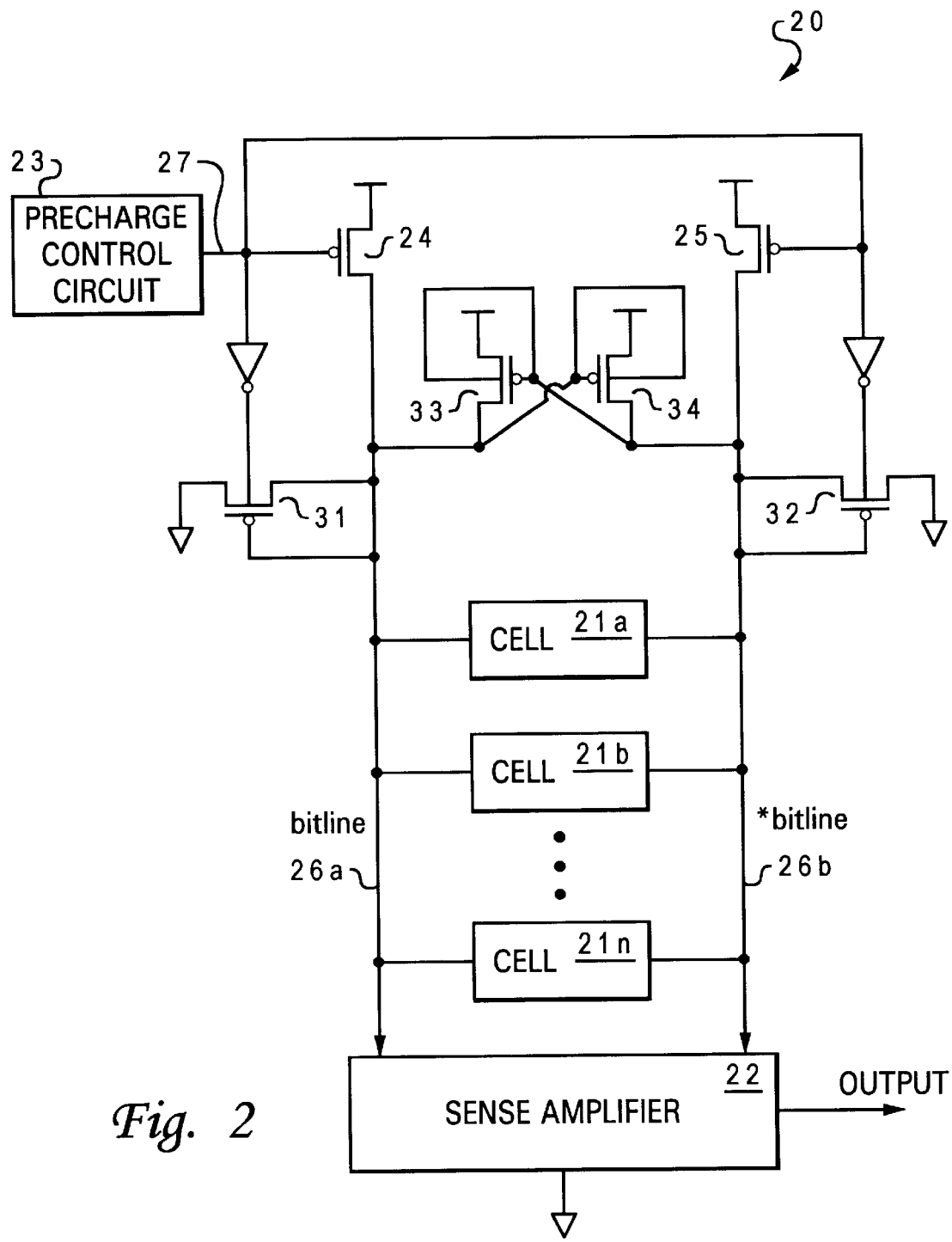
FIG. 2 is a block diagram of a column of storage cells within a memory device, in accordance with a preferred embodiment of the present invention.

With reference now to FIG. 2, there is depicted a block diagram of a column of storage cells within a memory device, in accordance with a preferred embodiment of the present invention. As shown, a memory device 20 includes storage cells 21a–21n, a sense amplifier 22, and a precharge control circuit 23. Each of storage cells 21a–21n are configured to output its stored state on complementary differential bitlines 26a and 26b. The differential signal from bitlines 26a and 26b is subsequently read by sense amplifier 22. Sense amplifier 22 then outputs either a logic "1" or "0," depending on the differential signal.

Before a read operation, differential bitlines 26a and 26b are precharged by p-channel precharge transistors 24 and 25 that are coupled between a voltage supply and differential bitlines 26a and 26b, respectively. Precharge cycles begin when a precharge signal at a precharge line 27 enters a logic low state. During a precharge cycle, precharge transistors 24 and 25 are driven by precharge control circuit 23 that generates an active-low precharge signal at precharge line 27. After precharge transistors 24, 25 are turned on by the active-low precharge signal, bitlines 26a and 26b are precharged by precharge transistors 24 and 25 to a voltage value of the power supply.

After the precharge cycle has been completed, any one of storage cells 21a–21n is allowed to drive differential bitlines 26a, 26b. During a read operation, if the stored value in one of storage cells 21a–21n is a logic "0," bitline 26a will be pulled from a precharged logic high state down to a logic low state, while *bitline 26b will maintain its precharged logic high state. As the bitlines start diverging in their respective voltage values, sense amplifier 22 senses the difference in voltage values between bitlines 26a, 26b, and sense amplifier 22 then drives its output to either a logic high or a logic low state, depending on the voltage differential.

As a preferred embodiment of the present invention, p-channel discharge transistors 31 and 32 are coupled to differential bitlines 26a and 26b, respectively, in order to enhance the pulldown rate of differential bitlines 26a and 26b during read operations. Specifically, the drain and gate of discharge transistor 31 is connected to bitline 26a, the source of discharge transistor 31 is connected to ground, and the body of discharge transistor 31 is connected to the inversion of the precharge signal on precharge line 27. Similarly, the drain and gate of discharge transistor 32 is connected to *bitline 26b, the source of discharge transistor 32 is connected to ground, and the body of discharge transistor 32 is connected to the inversion of the precharge signal from precharge control circuit 23.

When bitline 26a is being precharged (i.e., when precharge signal is low), bitline 26a is in a logic high state and discharge transistor 31 is turned off. In addition, because the body of discharge transistor 31 is in a logic high state when the precharge signal on precharge line 27 is in a logic low state, therefore, the body voltage of discharge transistor 31 is at its most noise immune state, allowing precharge transistor 24 to precharge bitline 26a to a logic high state with only small leakage through discharge transistor 31. Before bitline 26a is pulled down by one of storage cells 21a–21n during a read operation, the precharge signal on precharge line 27 enters a logic high state, and the body of discharge transistor 31 transitions to a logic low state. Thus, the threshold voltage, $V_t$, of discharge transistor 31 is lowered such that discharge transistor 31 is capable of responding more quickly to the logic state change on bitline 26a. As bitline 26a is changing from a logic high state to a logic low state, discharge transistor 31 will be turned on to help pulling bitline 26a down to the logic low state. As a result, the pulldown rate of bitline 26a is enhanced.

Discharge transistor 32 functions in a similar manner as discharge transistor 31 when *bitline 26b is being pulled down from a precharged logic high state to a logic low state by one of storage cells 21a–21n. Before *bitline 26b is pulled down by one of storage cells 21a–21n during a read operation, the precharge signal on precharge line 27 enters a logic high state, and the body of discharge transistor 32 transitions to a logic low state. Thus, the threshold voltage, $V_t$, of discharge transistor 32 is lowered such that discharge transistor 32 is capable of responding more quickly to the logic state change of *bitline 26b. As bitline 26b is changing from a logic high state to a logic low state, discharge transistor 32 will be turned on to help pulling bitline 26b down to a logic low state. As a result, the pulldown rate of bitline 26b is enhanced.

In order to achieve a good voltage differential between differential bitlines 26a and 26b when one of differential bitlines 26a, 26b is being pulled down by one of storage cells 21a–21n, p-channel isolation transistors 33 and 34 are coupled between differential bitlines 26a and 26b. Specifically, isolation transistors 33 and 34 are connected to each other in a cross-coupled manner. The gate of isolation transistor 33 is connected to the body of isolation transistor 33, the drain of isolation transistor 34 and *bitline 26b. Similarly, the gate of isolation transistor 34 is connected to the body of isolation transistor 34, the drain of isolation transistor 33 and bitline 26a.

For example, if bitline 26a is being pulled down while *bitline 26b is held at a logic high state, isolation transistor 33 stays off with its body at its most noise immune state. Thus, isolation transistor 34 turns on even stronger since the threshold voltage of isolation transistor 34 decreases. Thus, isolation transistor 33 will not interfere with bitline 26a being pulled down, and isolation transistor 34 will help even more to keep *bitline 26b at a logic high state. Similarly, if *bitline 26b is being pulled down while bitline 26a is held at a logic high state, isolation transistor 34 stays off with its body at its most noise immune state. Thus, isolation transistor 33 turns on even stronger because of the lower threshold voltage in isolation transistor 33. Thus, isolation transistor 34 will not interfere with *bitline 26b being pulled down, and isolation transistor 34 will contribute even more in keeping bitline 26a at a logic high state.

As has been described, the present invention provides an apparatus for increasing pulldown rate of a bitline within a memory device during a read operation. Because transistors 31–34 require voltage bias at their respective body terminal, it is understood by those skilled in the art that memory device 20 is preferably manufactured by a semiconductor processing technology that yields a floating substrate. Such semiconductor processing technology includes silicon-on-insulator (SOI), silicon-on-sapphire (SOS), etc., that are well-known in the art.

While the invention has been particularly shown and described with reference to a preferred embodiment, it will be understood by those skilled in the art that various changes in form and detail may be made therein without departing from the spirit and scope of the invention.

What is claimed is:

1. An memory device comprises:
   a pair of complementary differential bitlines, wherein each of said complementary differential bitlines is connected to a precharge transistor;
   a plurality of storage cells connected between said pair of complementary differential bitlines;
   a first discharge transistor connected to a first one of said complementary differential bitlines for increasing pulldown rate of said first one of said complementary differential bitlines during a read operation by sending a voltage to a body of said first discharge transistor to lower a threshold voltage of said first discharge transistor; and
   a second discharge transistor connected to a second one of said complementary differential bitlines for increasing pulldown rate of said second one of said complementary differential bitlines during said read operation by sending a voltage to a body of said second discharge transistor to lower a threshold voltage of said second discharge transistor.

2. The memory device of claim 1, wherein said memory device further includes a plurality of isolation transistors connected between said pair of complementary differential bitlines.

3. The memory device of claim 1, wherein said discharge transistors are p-channel transistors.

4. The memory device of claim 1, wherein said discharge transistors have a floating substrate.

5. The memory device of claim 1, wherein said discharge transistors are silicon-on-insulator transistors.

6. The memory device of claim 1, wherein said discharge transistors are silicon-on-sapphire transistors.

7. The memory device of claim 1, wherein said first discharge transistor has a gate and a drain connected to said first one of said pair of complementary differential bitlines, wherein said second discharge transistor has a gate and a drain connected to said second one of said pair of complementary differential bitlines.

8. The memory device of claim 7, wherein said first discharge transistor has a source connected to ground and said body connected to a precharge signal, wherein said second discharge transistor has a source connected to ground and said body connected to said precharge signal.

9. The memory device of claim 2, wherein said isolation transistors are connected in a cross-coupled configuration.

10. The memory device of claim 2, wherein each one of said isolation transistors has a drain connected to a respective one of said pair of complementary differential bitlines.

11. The memory device of claim 10, wherein each one of said isolation transistors has a gate connected to its body.

12. The memory device of claim 2, wherein said isolation transistors are p-channel transistors.

13. The memory device of claim 2, wherein said isolation transistors have a floating substrate.

14. The memory device of claim 2, wherein said isolation transistors are silicon-on-insulator transistors.

15. The memory device of claim 2, wherein said isolation transistors are silicon-on-sapphire transistors.

16. An memory device comprises:
- a pair of complementary differential bitlines, wherein each of said complementary differential bitlines is connected to a precharge transistor;
- a plurality of storage cells connected between said pair of complementary differential bitlines; and
- a discharge transistor, responsive to a variable body voltage, is connected to one of said pair of complementary differential bitlines for increasing pulldown rate of said one of said pair of complementary differential bitlines during a read operation, wherein said discharge transistor has a gate and a drain connected to said one of said pair of complementary differential bitlines.

17. The memory device of claim 16, wherein said discharge transistor has a source connected to ground and a body connected to a precharge signal.

18. The memory device of claim 16, wherein said discharge transistor has a floating substrate.

19. The memory device of claim 16, wherein said discharge transistor is a silicon-on-insulator transistor.

20. The memory device of claim 16, wherein said discharge transistor is a silicon-on-sapphire transistor.

* * * * *